(12) United States Patent
Ishii et al.

(10) Patent No.: US 10,435,808 B2
(45) Date of Patent: Oct. 8, 2019

(54) ETCHING APPARATUS USED FOR PHOTO ELECTROCHEMICAL ETCHING OF SEMICONDUCTOR SUBSTRATE

(71) Applicant: KABUSHIKI KAISHA TOYOTA CHUO KENKYUSHO, Nagakute-shi, Aichi (JP)

(72) Inventors: Eiko Ishii, Nagakute (JP); Yumi Saito, Nagakute (JP); Teruhisa Akashi, Nagakute (JP); Kenji Nakashima, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 0 days.

(21) Appl. No.: 15/711,540

(22) Filed: Sep. 21, 2017

(65) Prior Publication Data

US 2018/0112325 A1    Apr. 26, 2018

(30) Foreign Application Priority Data

Oct. 21, 2016    (JP) .................................. 2016-207201

(51) Int. Cl.
| | | |
|---|---|---|
| *C25F 5/00* | (2006.01) | |
| *C25F 3/02* | (2006.01) | |
| *C25F 7/00* | (2006.01) | |
| *H01L 21/3063* | (2006.01) | |

(52) U.S. Cl.
CPC .................. *C25F 3/02* (2013.01); *C25F 7/00* (2013.01); *H01L 21/3063* (2013.01)

(58) Field of Classification Search
CPC ............................ C02F 2301/024; C25B 1/003
USPC ........................................................ 204/248
See application file for complete search history.

(56) References Cited

U.S. PATENT DOCUMENTS 5,863,706 A * 1/1999 Komatsu ............... C23C 16/047
216/51
2014/0311675 A1    10/2014 Yi et al.

FOREIGN PATENT DOCUMENTS

| JP | S47-4115 A | 2/1972 |
|---|---|---|
| JP | H03-185725 A | 8/1991 |
| JP | H05-198558 A | 8/1993 |
| JP | H10-256227 A | 9/1998 |

(Continued)

OTHER PUBLICATIONS

Sep. 11, 2018 Notification of Reasons for Refusal issued in Japanese Patent Application No. 2016-207201.

(Continued)

*Primary Examiner* — Zulmariam Mendez
(74) *Attorney, Agent, or Firm* — Oliff PLC (57) ABSTRACT

An etching apparatus having a liquid bath storing an etching liquid, a substrate installation part capable of supporting the semiconductor substrate in vertical placement at a position at which a treatment surface of the semiconductor substrate is immersed in the etching liquid, a sample electrode provided at the substrate installation part and electrically connected to the semiconductor substrate, a counter electrode disposed at a position at which the counter electrode is immersed in the etching liquid in the liquid bath, a light source irradiating the treatment surface of the semiconductor substrate with light, and an irradiation window provided between the treatment surface of the semiconductor substrate and the light source and at a position separated from the semiconductor substrate in a horizontal direction.

9 Claims, 6 Drawing Sheets

(56) References Cited

FOREIGN PATENT DOCUMENTS

| | | |
|---|---|---|
| JP | H11-229199 A | 8/1999 |
| JP | 2003-077887 A | 3/2003 |
| JP | 2008-109162 A | 5/2008 |
| JP | 2015-503240 A | 1/2015 |

OTHER PUBLICATIONS

Nov. 27, 2018 Notification of Reasons for Refusal issued in Japanese Patent Application No. 2016-207201.

* cited by examiner

ETCHING APPARATUS USED FOR PHOTO ELECTROCHEMICAL ETCHING OF SEMICONDUCTOR SUBSTRATE

TECHNICAL FIELD

The present invention relates to an etching apparatus used for photo electrochemical etching of a semiconductor substrate.

BACKGROUND ART

Photo electrochemical (PEC) etching may be used when etching a semiconductor substrate. Patent Literature 1, 2 describes a technique of etching a GaN semiconductor substrate using the photo electrochemical etching. In Patent Literature 1, a GaN semiconductor substrate placed horizontally in an etching liquid is irradiated from above with UV light (ultraviolet rays) having a wavelength shorter than the wavelength (365 nm) which corresponds to the band gap of GaN. This generates electron-hole pairs in the GaN. Electrons are extracted by the applied bias while the remaining holes migrate to the surface side of the GaN. Then, the GaN reacts with OH-ions in a potassium hydroxide (KOH) aqueous solution to be etched while repeating oxidation/dissolution at the GaN surface. In Patent Literature 2, a mercury lamp as the light source is housed in a holder and immersed in the etching liquid. The holder is provided with an irradiation window and the GaN semiconductor substrate is fixed to the holder to be vertically placed at a position at which the GaN semiconductor substrate is in contact with the irradiation window. The treatment surface (surface in contact with the irradiation window) of the vertically-placed GaN semiconductor substrate is irradiated from its side with light from the light source.

CITATION LIST

Patent Literature

[PTL 1]
JP2008-109162A
[PTL 2]
JP11-229199A

SUMMARY OF INVENTION

Technical Problem

To industrially carry out the photo electrochemical etching of semiconductor substrates, demands exist for the development of an etching apparatus that can treat a number of semiconductor substrates at high speed and with high accuracy. If, as in Patent Literature 1, the semiconductor substrate is horizontally placed, the installation area for the apparatus will have to be made large to increase the number of treating semiconductor substrates. This technique therefore has a problem in that the apparatus may be large and increase the cost. In contrast, the installation area can be reduced when vertically placing the semiconductor substrate, as in Patent Literature 2, and irradiating the semiconductor substrate from its side with light. In Patent Literature 2, however, etching is performed in a state in which the semiconductor substrate is fixed to the holder housing the light source and the treatment surface of the semiconductor substrate is in contact with the irradiation window. This technique therefore has a problem in that the etching accuracy tends to be poor because the etching liquid may not get across the treatment surface and bubbles generated during the etching are liable to be insufficiently removed.

In consideration of the above, the present inventors aim to provide an etching apparatus that requires less installation area and lower cost and can treat a number of semiconductor substrates at high speed and with high accuracy.

Solution to Problem

The present invention provides an etching apparatus used for photo electrochemical etching of a semiconductor substrate. This etching apparatus comprises a liquid bath storing an etching liquid, a substrate installation part capable of supporting the semiconductor substrate in vertical placement at a position at which a treatment surface of the semiconductor substrate is immersed in the etching liquid, a sample electrode provided at the substrate installation part and electrically connected to the semiconductor substrate, a counter electrode disposed at a position at which the counter electrode is immersed in the etching liquid in the liquid bath, a light source irradiating the treatment surface of the semiconductor substrate with light, and an irradiation window provided between the treatment surface of the semiconductor substrate and the light source and at a position separated from the semiconductor substrate in a horizontal direction.

In the etching apparatus of the present invention, the semiconductor substrate is installed in vertical placement at the substrate installation part and the treatment surface of the semiconductor substrate can be treated in a state in which the treatment surface is immersed in the etching liquid. Accordingly, an etching apparatus can be provided which can treat a number of semiconductor substrates even with a relatively small installation area. The term "vertical placement" and similar terms as used in the present description refer to a situation that the semiconductor substrate is installed in a state in which a planar vector on the treatment surface of the semiconductor substrate is closer to the vertical direction than to the horizontal direction. In the etching apparatus of the present invention, the irradiation window is provided between the treatment surface of the semiconductor substrate and the light source and at a position separated from the semiconductor substrate in the horizontal direction. The term "horizontal direction" as used in the present description refers to a direction that is closer to the horizontal direction than to the vertical direction. The light emitted from the light source passes through the irradiation window, then passes through the etching liquid between the semiconductor substrate and the irradiation window in the horizontal direction, and arrives at the treatment surface of the semiconductor substrate to progress the etching of the treatment surface. Thus, even though the semiconductor substrate is vertically placed, the etching liquid can get across the treatment surface and bubbles generated during the etching can be sufficiently removed. This can ensure both the speed and the accuracy of etching. That is, according to the present invention, there can be provided an etching apparatus that requires less installation area and lower cost and can treat a number of semiconductor substrates at high speed and with high accuracy.

In the present invention, the counter electrode is preferably disposed outside a region surrounded by a set of straight lines that extend from a circumferential edge of the treatment surface of the semiconductor substrate toward the irradiation window in a normal direction of the treatment surface of the semiconductor substrate. This can prevent the counter electrode from blocking the light which passes through the irradiation window and arrives at the treatment surface of the semiconductor substrate.

In the present invention, the etching apparatus preferably further comprises a stirring mechanism that stirs the etching liquid. This can promote the removal of bubbles generated at the treatment surface of the semiconductor substrate and the supply of etching liquid to the treatment surface thereby to improve the speed and accuracy of the etching.

In the present invention, the stirring mechanism may be a vibrator that vibrates the semiconductor substrate. Vibrating the semiconductor substrate itself allows the bubbles generated at the treatment surface to be effectively removed.

In the present invention, the substrate installation part may be provided at a side surface of the liquid bath. This can more simplify the structure of the apparatus. In one or more embodiments of the present invention, the substrate installation part may comprise a substrate installation hole provided at the side surface of the liquid bath, a substrate sealing mechanism provided at the side surface of the liquid bath along a circumference of the substrate installation hole, and a substrate pressing mechanism that presses the treatment surface of the semiconductor substrate against the substrate sealing mechanism. This allows easy attachment and detachment of the semiconductor substrate and the process can be simplified because the etching liquid is not in contact with the surface, which is not to be treated, of the semiconductor substrate.

In the present invention, the liquid bath may further comprise an irradiation window installation part at which the irradiation window is installed. This can more simplify the structure of the apparatus.

DESCRIPTION OF EMBODIMENTS

The etching apparatus of the present invention comprises a liquid bath, a substrate installation part, a sample electrode, a counter electrode, a light source, and an irradiation window. The liquid bath stores an etching liquid. The substrate installation part can support a semiconductor substrate in a state of vertical placement. The term "vertical placement" and similar terms as used in the present description refer to a situation that the semiconductor substrate is installed in a state in which a planar vector on the treatment surface of the semiconductor substrate is closer to the vertical direction than to the horizontal direction. In order to uniformly irradiate the treatment surface of the semiconductor substrate with light, the semiconductor substrate may preferably be, but is not limited to being, vertically placed so that a planar vector on the treatment surface is approximately in the vertical direction.

The semiconductor substrate to be etched is not particularly limited. Examples of the semiconductor substrate to be appropriately etched include a GaN substrate, a silicon substrate, and a silicon carbide substrate. The etching liquid may be selected in accordance with the semiconductor substrate to be etched. The etching liquid contains an acid or alkali. A member to be in contact with the etching liquid is formed of a material that has corrosion resistance to the etching liquid. Examples of nonconductive materials having such corrosion resistance include a vinyl chloride-based resin, fluorine-based resin, polypropylene, and alumina ceramic, which can be suitably used as the material for the liquid bath and the like. Sapphire glass can be suitably used as the material for the irradiation window. Examples of conductive materials having corrosion resistance include gold and platinum, which can be suitably used as the material for the counter electrode and the like.

It suffices that the liquid bath is in a shape that allows the etching liquid to be stored therein when the semiconductor substrate is installed. For example, the liquid bath may be in an approximately cylindrical shape having a circular bottom surface and a side surface that merges into the circular bottom surface or in an approximately prismatic shape having a polygonal bottom surface and side surfaces that merge into the polygonal bottom surface or may also be in a shape, such as a double cylinder, having a circular bottom surface and an outer and inner side surfaces that merge into the circular bottom surface.

The substrate installation part may be a separate member that can be detachably attached to the liquid bath, or may also be fixed to the liquid bath. In an embodiment, the substrate installation part may be, for example, a part of the liquid bath, such as the side surface of the liquid bath. In an embodiment, the substrate installation part may be, for example, a tab-like member that nips the outer edge of the semiconductor substrate. In an embodiment, the substrate installation part may be, for example, a member that supports the semiconductor substrate so as to press it. Specifically, the substrate installation part may comprise a substrate installation hole provided at the side surface of the liquid bath, a substrate sealing mechanism provided at the side surface of the liquid bath along a circumference of the substrate installation hole, and a substrate pressing mechanism that presses the treatment surface of the semiconductor substrate against the substrate sealing mechanism. When the semiconductor substrate is brought into contact with the substrate installation hole in a direction in which the treatment surface is directed toward the inside of the liquid bath and the substrate pressing mechanism presses the semiconductor substrate toward the inside of the liquid bath from the side which is not to be treated, the substrate sealing mechanism (e.g. an O-ring) achieves a sealed state. This results in a state in which the substrate installation hole is closed by the semiconductor substrate and the substrate sealing mechanism and the treatment surface of the semiconductor substrate is exposed inside the liquid bath. When, in this state, the etching liquid is stored in the liquid bath, the surface to be treated of the semiconductor substrate is brought into contact with the etching liquid. Thus, the treatment surface of the semiconductor substrate serves as a part of the side surface of the liquid bath.

The light source can be appropriately selected in accordance with etching conditions, such as the types of the semiconductor substrate and etching liquid. For example, a high-energy laser light source can be used as the light source, such as used in a typical semiconductor production process. When a silicon carbide substrate is etched using an etching liquid as described in the description of Japanese Patent Application No. 2016-102723, for example, the etching speed can be sufficiently increased even when using a light source (e.g. a xenon lamp) having a power density of about 600 mW/cm$^2$ to 1,400 mW/cm$^2$. The use of such a light source having a relatively low power density can avoid an increased size and cost of the apparatus.

The irradiation window is provided between the treatment surface of the semiconductor substrate and the light source and at a position separated from the semiconductor substrate in the horizontal direction. When the treatment surface of the semiconductor substrate installed in vertical placement is irradiated with light, the light propagates in the horizontal direction from the light source. The irradiation window is therefore disposed in the horizontal direction with respect to the semiconductor substrate. When the etching liquid is stored in the liquid bath, the irradiation window is preferably in a state of being contact with the etching liquid. In order to uniformly irradiate the treatment surface of the semiconductor substrate with light, the irradiation window is preferably disposed at a position at which the irradiation window faces the treatment surface of the semiconductor substrate. In particular, it is preferred that the surface of the irradiation window at the semiconductor substrate side be approximately parallel to the treatment surface of the semiconductor substrate. The treatment surface of the semiconductor substrate and the irradiation window are preferably separated from each other to such an extent that the etching liquid can rapidly move through the space therebetween.

The light source may be housed in a holder so that they can be taken in and out of the liquid bath. In this case, the irradiation window may be fixed to the holder so that the irradiation window can also be taken in and out of the liquid bath together with the holder. In an embodiment, the irradiation window may be fixed to a part of the liquid bath, such as a wall surface of the liquid bath. For example, the side surface of the liquid bath may be provided with a hole for installation of the irradiation window and the irradiation window may be fixed so as to occupy the hole. In addition or alternatively, the irradiation window may be installed in an attachable and detachable manner at an irradiation window installation part that is provided at the liquid bath. Specifically, the irradiation window installation part may comprise an irradiation window installation hole provided at the side surface of the liquid bath, an irradiation window sealing mechanism provided at the side surface of the liquid bath along a circumference of the irradiation window installation hole, and an irradiation window pressing mechanism that presses the irradiation window against the sealing mechanism. For example, when the irradiation window is brought into contact with the irradiation window installation hole from outside the liquid bath and the irradiation window pressing mechanism presses the irradiation window toward the inside of the liquid bath, the irradiation window sealing mechanism (e.g. an O-ring) achieves a sealed state. This results in a state in which the irradiation window installation hole is closed by the irradiation window and the irradiation window sealing mechanism and the irradiation window is exposed inside the liquid bath.

The sample electrode, which is provided at the substrate installation part, gets electrically connected to the semiconductor substrate when the semiconductor substrate is installed at the substrate installation part. The sample electrode may be disposed at a position at which the sample electrode is immersed in the etching liquid or may also be disposed at a position at which the sample electrode is not immersed in the etching liquid. The sample electrode is preferably disposed so as to be in contact with the surface, which is not to be treated, of the semiconductor substrate. In an embodiment, a part or whole of the surface, which is not to be treated, of the semiconductor substrate may be formed with an electrode and this electrode and the sample electrode may be brought into contact with each other thereby to achieve electrical connection therebetween. For example, when the semiconductor substrate is installed such that the surface, which is not to be treated, of the semiconductor substrate does not contact with the etching liquid, the sample electrode can be disposed at a position at which the sample electrode is not immersed in the etching liquid, such as by disposing the sample electrode at the side, which is not to be treated, of the semiconductor substrate. When the sample electrode is not immersed in the etching liquid, a material for the sample electrode can be selected without considering the corrosion resistance to the etching liquid, and this may be preferred. Specifically, a material having electrical conductivity can be used as the material for the sample electrode. Although not particularly limited, a material, such as copper and aluminum, which has low conductivity can be suitably used.

The counter electrode is disposed at a position at which the counter electrode is immersed in the etching liquid. It is therefore preferred that a material, such as platinum and gold, which is excellent in the corrosion resistance be used as the material for the counter electrode. The counter electrode is preferably disposed at a position at which the counter electrode does not block or interfere with the optical path of light emitted from the light source and arriving at the treatment surface of the semiconductor substrate. Specifically, the counter electrode is preferably disposed outside a region surrounded by a set of straight lines that extend from the circumferential edge of the treatment surface of the semiconductor substrate toward the irradiation window in the normal direction of the treatment surface of the semiconductor substrate. In an embodiment, the counter electrode is preferably disposed outside a region surrounded by a set of straight lines that connect between the circumferential edge of the treatment surface of the semiconductor substrate and the circumferential edge of the irradiation window. In an embodiment, the counter electrode is preferably installed at a position nearer to the semiconductor substrate than to the irradiation window. In particular, the counter electrode is preferably installed within a range of a distance from the semiconductor substrate of about 1 cm. As the counter electrode comes closer to the semiconductor substrate, the liquid resistance to the current flow during the etching is reduced, and the etching speed can therefore be made high.

The etching apparatus of the present invention preferably further comprises a stirring mechanism that stirs the etching liquid. This can promote the removal of bubbles generated at the treatment surface of the semiconductor substrate and the supply of etching liquid to the treatment surface thereby to improve the speed and accuracy of the etching. The stirring mechanism may be, for example, a stirrer that rotates in the liquid. In an embodiment, the stirring mechanism may be a means that shakes the liquid bath and/or the substrate installation part. In an embodiment, the stirring mechanism may be a vibrator that vibrates the semiconductor substrate. Vibrating the semiconductor substrate itself allows the bubbles generated at the treatment surface to be effectively removed. The vibrator may be in contact with the semiconductor substrate to directly vibrate the semiconductor substrate or may also be fixed to a member, such as the sample electrode and the substrate installation part, which is in contact with the semiconductor substrate to indirectly vibrate the semiconductor substrate.

EXAMPLES

Example 1

Figure 1:
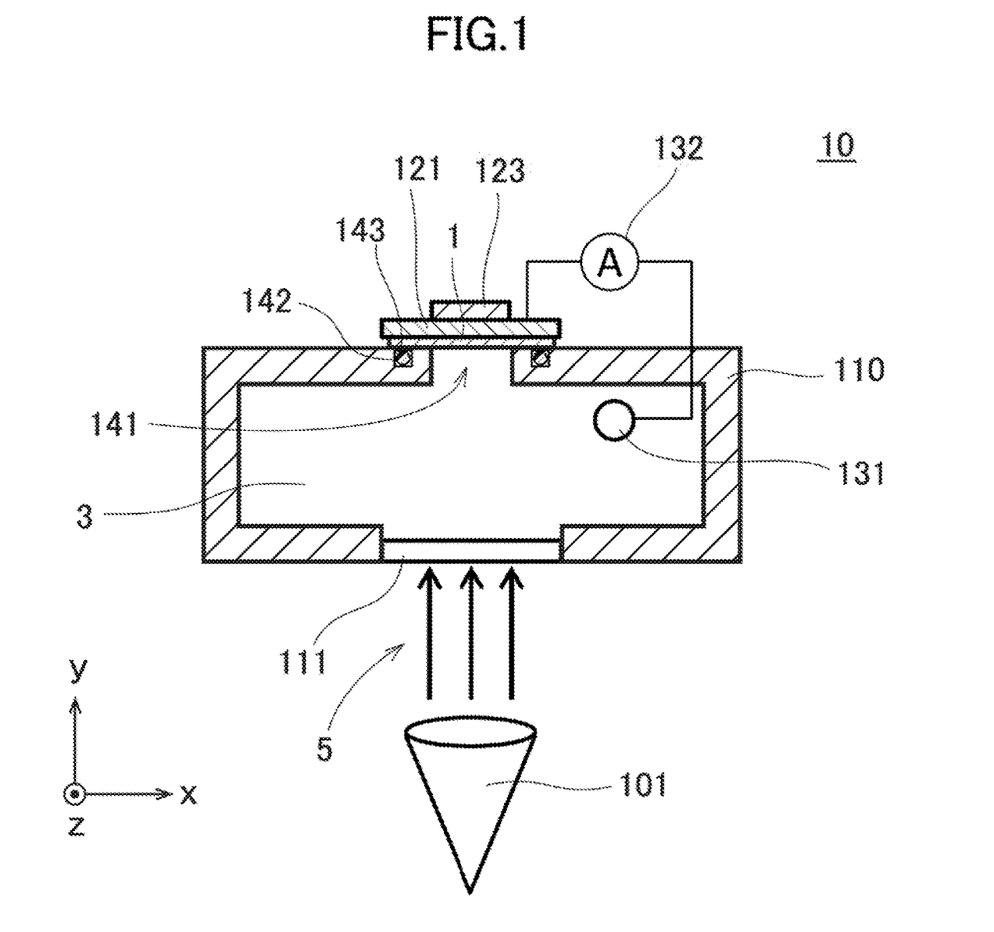
FIG. 1 is a view illustrating the overview of an etching apparatus of Example 1.

FIG. 1 is a schematic view when viewing an etching apparatus 10 in the plan view. The z-axis illustrated in FIGS. 1 to 6 is parallel to the vertical direction and the positive direction of the z-axis is directed vertically upward. The etching apparatus 10 comprises a light source 101, a liquid bath 110, an irradiation window 111, a sample electrode 121, a counter electrode 131, and a vibrator 123. The liquid bath 110 is an approximately prismatic container and has a bottom surface parallel to the xy-plane, two side surfaces parallel to the yz-plane, and two side surfaces parallel to the zx-plane. The liquid bath 110 stores an etching liquid 3. The liquid bath 110 is made of a vinyl chloride resin and thus has corrosion resistance to the etching liquid 3.

One of the side surfaces of the liquid bath 110 parallel to the zx-plane is provided with a substrate installation hole 141 while the other is provided with the irradiation window 111. The substrate installation hole 141 is opened along the treatment surface of a semiconductor substrate 1. In the present example, the semiconductor substrate 1 is in a disk-like shape, but may also be in an approximately rectangular shape. The substrate installation hole 141 is formed at the side surface of the liquid bath 110, as a circular hole having a smaller outer diameter than that of the semiconductor substrate 1. A circumferential groove 142 is provided at the outer surface of the liquid bath 110 along the circumferential edge of the substrate installation hole 141 and a sealing material 143 (O-ring) is fitted in the groove 142. The groove 142 and the sealing material 143 represent an example of the substrate sealing mechanism which, together with the substrate installation hole 141 and a pressing mechanism (not illustrated), constitutes an example of the substrate installation part.

The semiconductor substrate 1 is installed at the outer surface side of the liquid bath 110 so that the circumferential edge of the treatment surface comes into contact with the sealing material 143. The surface, which is not to be treated, of the semiconductor substrate 1 (opposite surface to the surface which is to be treated) is in contact with the sample electrode 121. The vibrator 123 is fixed to the rear surface of the sample electrode 121 (surface at the reverse side to the surface which is in contact with the semiconductor substrate 1). The pressing mechanism, which is not illustrated, presses the sample electrode 121 toward the outer surface of the liquid bath 110 and the semiconductor substrate 1 is thereby pressed against the outer surface of the liquid bath 110 and brought into close contact with the sealing material 143 to achieve a sealed state. The semiconductor substrate 1 is installed in vertical placement so as to close the substrate installation hole 141 which is provided at the side surface parallel to the zx-plane, and the treatment surface of the semiconductor substrate 1 is thus in a state of being parallel to the zx-plane. The treatment surface of the semiconductor substrate 1 is directed to inside of the liquid bath 110 and immersed in the etching liquid 3. The surface, which is not to be treated, of the semiconductor substrate 1, the sample electrode 121, and the vibrator 123 are disposed outside the liquid bath 110 and are not immersed in the etching liquid 3. The material of the sample electrode 121 is copper.

The irradiation window 111 is embedded in a hole provided at a position at which the irradiation window 111 faces the substrate installation hole 141 in the y-direction. The irradiation window 111 is a flat plate of sapphire glass and is fixed to the side surface of the liquid bath 110 in a state of being parallel to the zx-plane. The area of the irradiation window 111 in the zx-directions is larger than the area of the substrate installation hole 141 in the zx-directions. The irradiation window 111 is in contact with the etching liquid 3. The irradiation window 111 has corrosion resistance to the etching liquid 3.

The counter electrode 131 is installed in the vicinity of the substrate installation hole 141 and immersed in the etching liquid 3. The sample electrode 121 and the counter electrode 131 are connected to each other through wirings via an ammeter 132. The material of the counter electrode 131 is gold and the counter electrode 131 therefore has corrosion resistance to the etching liquid 3.

The light source 101 is a xenon lamp that can emit light of a wavelength of 254 to 400 nm and a power density of about 600 to 1,400 mW/cm$^2$. The light source 101 emits a light beam 5, which passes through the irradiation window 111 and the etching liquid 3 and arrives at the treatment surface of the semiconductor substrate 1. This allows the treatment surface of the semiconductor substrate 1 to be etched and current flows through the semiconductor substrate 1, sample electrode 121, ammeter 132, counter electrode 131, and etching liquid 3. Etching of the treatment surface of the semiconductor substrate 1 generates bubbles at the treatment surface. The vibrator 123, which is an ultrasonic vibrator, vibrates during the etching treatment to vibrate the semiconductor substrate 1 via the sample electrode 121. This promotes the removal of bubbles generated at the treatment surface of the semiconductor substrate 1 to increase the etching speed.

Figure 2:
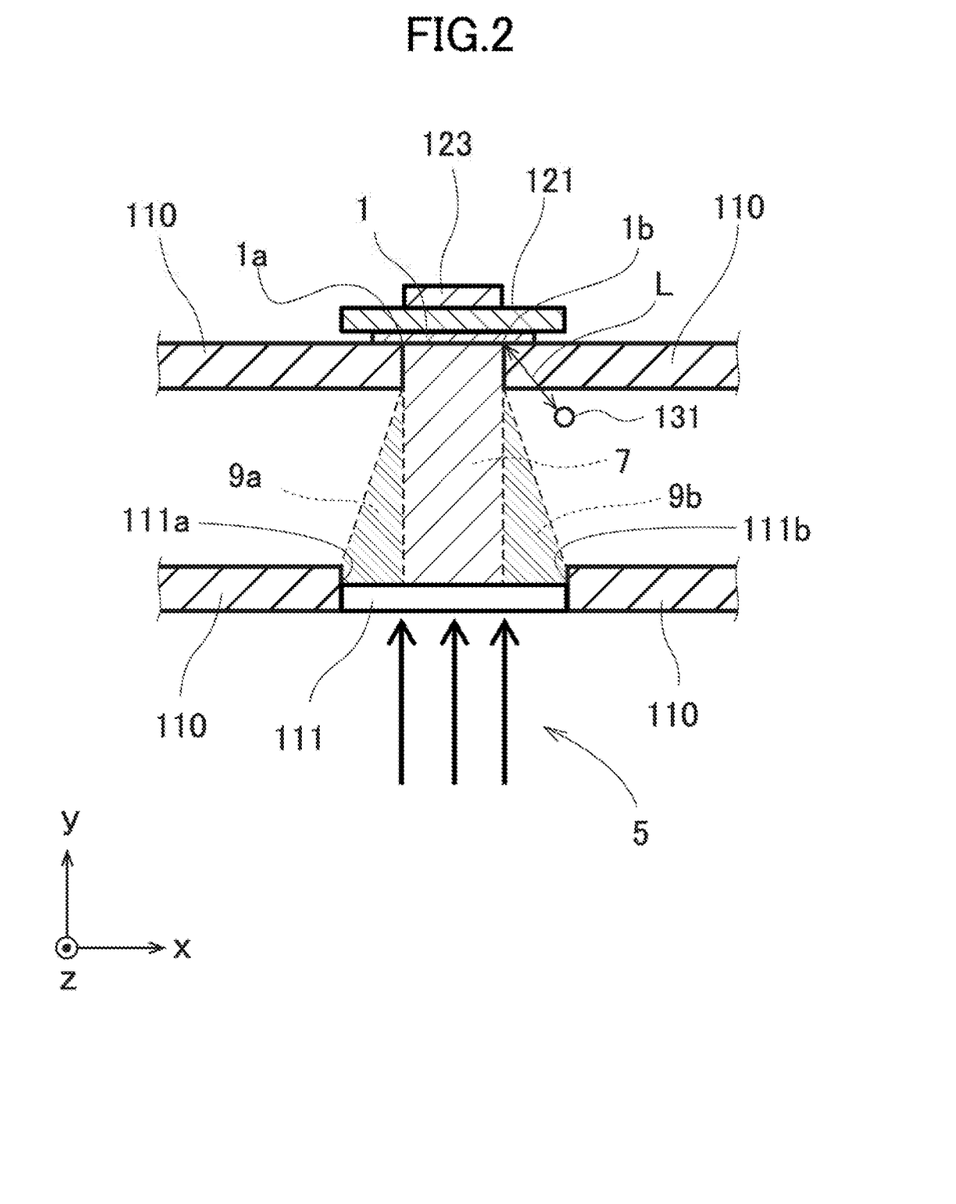
FIG. 2 is a view for describing a position at which a counter electrode of FIG. 1 is installed.

The counter electrode 131 is installed within a range of a distance from the semiconductor substrate of about 1 cm. More specifically, as illustrated in FIG. 2, the counter electrode 131 is installed at a position at which a distance L between an end part 1b of the semiconductor substrate 1 in contact with the etching liquid 3 (an end part that is nearest to the counter electrode 131) and the counter electrode 131 is about 1 cm or shorter. When the counter electrode 131 is disposed in the vicinity of the semiconductor substrate 1 in the above manner, the resistance to the current which flows between the counter electrode 131 and the semiconductor substrate 1 via the etching liquid 3 is reduced and the etching speed is therefore made high.

The counter electrode 131 is disposed at a position at which the counter electrode 131 does not block the optical path of the light beam 5 emitted from the light source 101 and arriving at the treatment surface of the semiconductor substrate 1. Specifically, the counter electrode 131 is preferably disposed within a region outside a region 7 illustrated in FIG. 2 and particularly preferably disposed within a region outside regions 7, 9a, and 9b. The region 7 refers to a cylindrical region surrounded by the cylindrical surface, which is obtained by extending the circumferential edge (both ends in the x-direction are denoted by reference numerals 1a and 1b) of the circular treatment surface of the semiconductor substrate 1 along the normal direction (y-direction) of the treatment surface, the treatment surface of the semiconductor substrate 1, and the surface of the irradiation window 111 which is exposed inside the liquid bath 110. The regions 9a and 9b are added to the region 7 to define a circular truncated cone-like region of which the upper surface is the circular treatment surface of the semiconductor substrate 1 and the lower surface is the circular irradiation window 111 (both ends in the x-direction are denoted by reference numerals 111a and 111b). This circular truncated cone-like region represents a region surrounded by a set of straight lines that connect between the circumferential edge of the treatment surface of the semiconductor substrate 1 and the circumferential edge of the irradiation window 111.

As described above, in the etching apparatus 10, the semiconductor substrate 1 is installed in vertical placement at the substrate installation part provided at the liquid bath 110 and can be treated in a state in which the treatment surface of the semiconductor substrate 1 is immersed in the etching liquid 3. The etching apparatus 10 is thus provided which can treat the semiconductor substrate 1 even with a relatively small installation area. In addition, the treatment surface of the semiconductor substrate 1 and the irradiation window 111 are separated from each other in the horizontal direction and a sufficient amount of the etching liquid 3 exists between the treatment surface of the semiconductor substrate 1 and the irradiation window 111. The etching treatment can therefore be performed at an increased etching speed and with high accuracy. Moreover, the etching apparatus 10 is provided with a vibrator that vibrates the semiconductor substrate 1 during the etching. This allows the bubbles generated at the treatment surface of the semiconductor substrate 1 to be effectively removed and the etching treatment can thus be performed at an increased etching speed and with high accuracy. Furthermore, in the etching apparatus 10, the counter electrode 131 is disposed at a position at which the counter electrode 131 does not block the optical path of the light beam 5 emitted from the light source 101 and arriving at the treatment surface of the semiconductor substrate 1, that is, a position located in the vicinity of the semiconductor substrate 1. The etching treatment can therefore be performed at an increased etching speed and with high accuracy. In addition, in the etching apparatus 10, the sample electrode 121 is not immersed in the etching liquid 3 and, therefore, a popular material such as copper can be used as the electrode material. As will be understood, such a material is inexpensive as compared with a material, such as gold and platinum, which has corrosion resistance to the etching liquid 3.

Example 2

Figure 3:
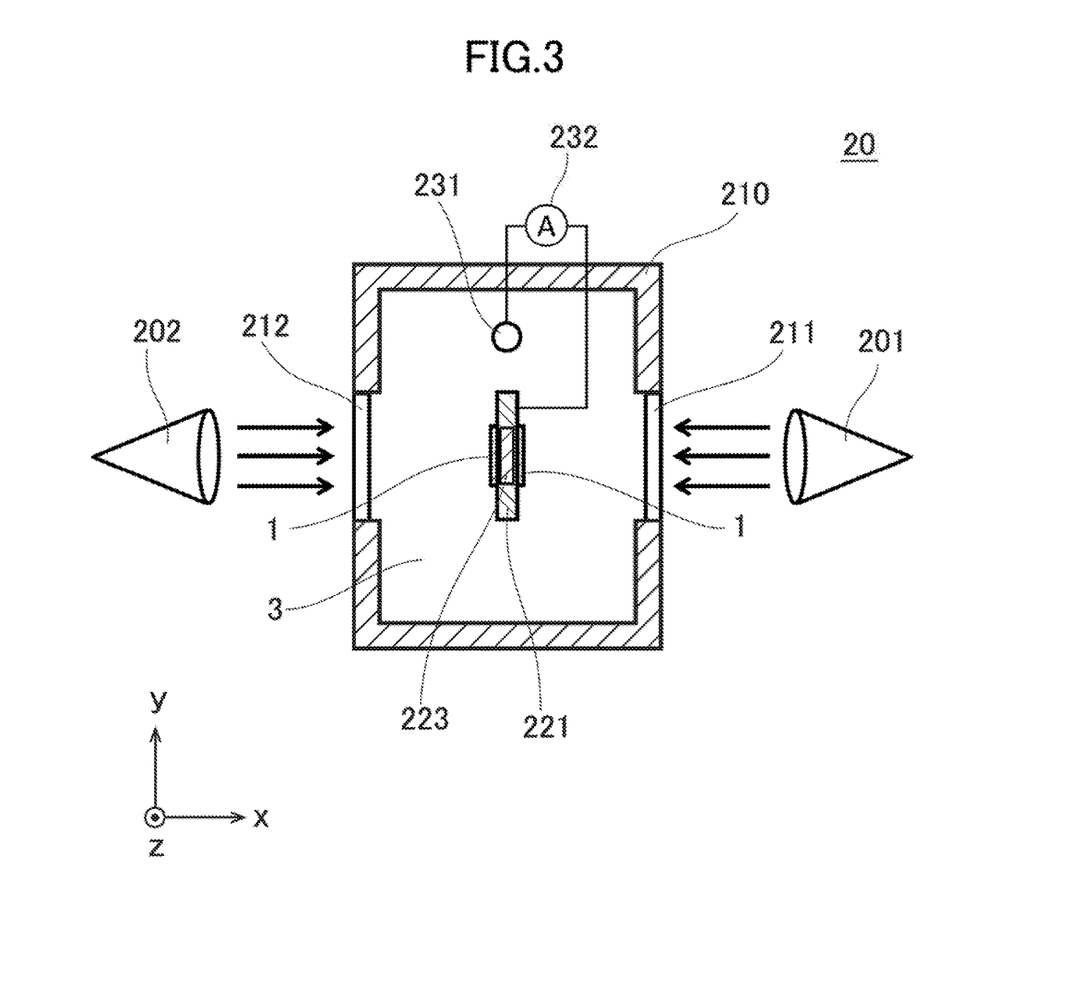
FIG. 3 is a view illustrating the overview of an etching apparatus of Example 2.

Description will then be made with reference to FIGS. 3 to 6, which exemplify etching apparatuses that can each perform etching treatment for a plurality of semiconductor substrates 1 at the same time. FIG. 3 illustrates an etching apparatus 20 configured to be capable of concurrent treatment for two semiconductor substrates 1. A liquid bath 210 is provided which is an approximately prismatic container and stores an etching liquid 3. Irradiation windows 211 and 212 are fixed to two side surfaces of the liquid bath 210 that face each other in the x-direction. A sample electrode 221 and a vibrator 223 are disposed inside the liquid bath 210 (inside the container) and immersed in the etching liquid 3 and, therefore, a material having corrosion resistance to the etching liquid 3 is used for the sample electrode 221 and the vibrator 223. The sample electrode 221 serves also as a substrate installation part, so that the two semiconductor substrates 1 can be fixed in vertical placement to both surfaces of the sample electrode 221 in the x-direction. The vibrator 223 is fixed to a surface of the sample electrode 221 in the z-direction. A counter electrode 231 is provided to be immersed in the etching liquid 3. The sample electrode 221 and the counter electrode 231 are connected to each other through wirings via an ammeter 232. The counter electrode 231 is disposed outside a region surrounded by a set of straight lines that extend from the circumferential edges of the treatment surfaces of the semiconductor substrates 1 toward the irradiation windows 211 and 212 in the normal direction of the treatment surfaces of the semiconductor substrates 1. Light sources 201 and 202 are installed outside the liquid bath 210 and emit light toward the treatment surfaces of the semiconductor substrates 1 which are installed at the sample electrode 221 in the liquid bath 210. Functions of each configuration of the etching apparatus 20 other than the above are the same as those of Example 1 and the description thereof will be omitted.

Example 3

Figure 4:
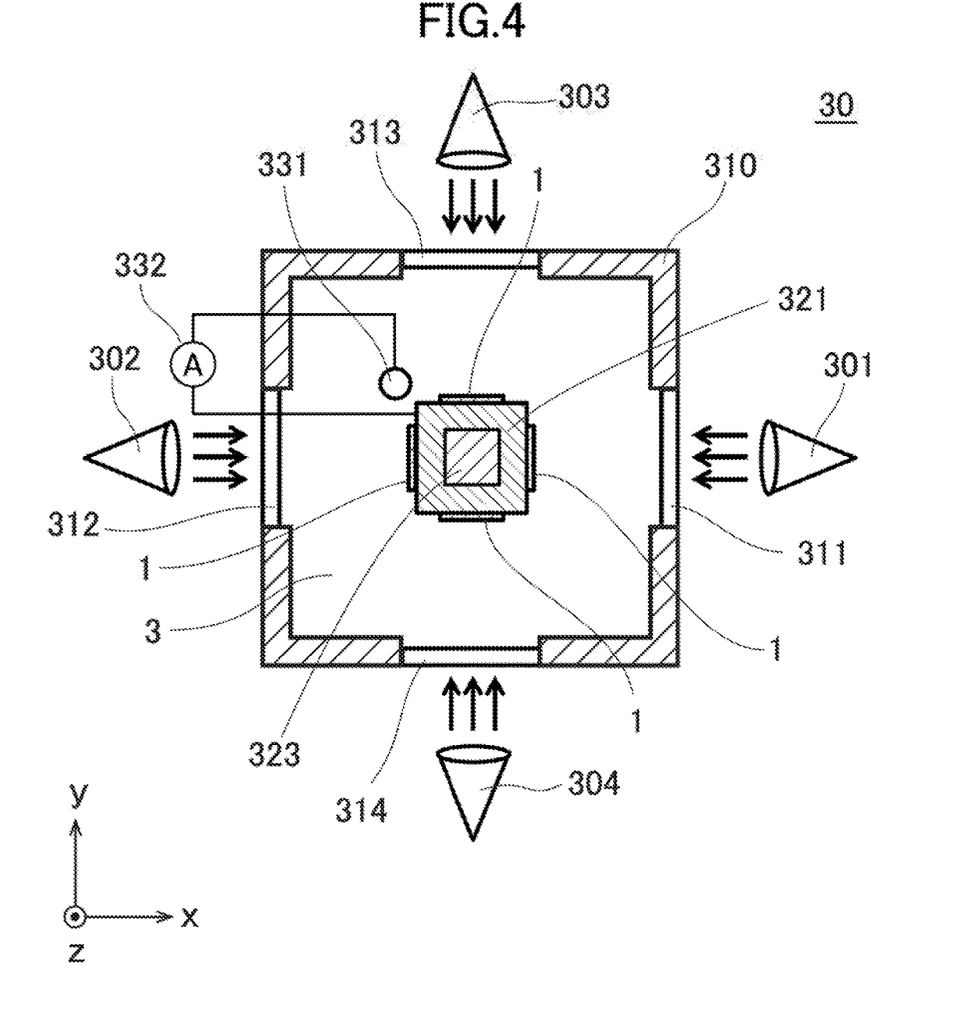
FIG. 4 is a view illustrating the overview of an etching apparatus of Example 3.

FIG. 4 illustrates an etching apparatus 30 configured to be capable of concurrent treatment for four semiconductor substrates 1. A liquid bath 310 is provided which is an approximately prismatic container and stores an etching liquid 3. Irradiation windows 311 and 312 are fixed to two side surfaces of the liquid bath 310 that face each other in the x-direction while irradiation windows 313 and 314 are fixed to two side surfaces of the liquid bath 310 that face each other in the y-direction. A sample electrode 321 and a vibrator 323 are disposed inside the liquid bath 310 (inside the container) and immersed in the etching liquid 3 and, therefore, a material having corrosion resistance to the etching liquid 3 is used for the sample electrode 321 and the vibrator 323. The sample electrode 321 serves also as a substrate installation part, so that two semiconductor substrates 1 can be fixed in vertical placement to both surfaces of the sample electrode 321 in the x-direction while the other two semiconductor substrates 1 can be fixed in vertical placement to both surfaces of the sample electrode 321 in the y-direction. The vibrator 323 is fixed to a surface of the sample electrode 321 in the z-direction. A counter electrode 331 is provided to be immersed in the etching liquid 3. The sample electrode 321 and the counter electrode 331 are connected to each other through wirings via an ammeter 332. The counter electrode 331 is disposed outside a region surrounded by a set of straight lines that extend from the circumferential edges of the treatment surfaces of the semiconductor substrates 1 toward the irradiation windows 311, 312, 313, and 314 in the normal directions of the treatment surfaces of the semiconductor substrates 1. Light sources 301 to 304 are installed outside the liquid bath 310 and emit light toward the treatment surfaces of the semiconductor substrates 1 which are installed at the sample electrode 321 in the liquid bath 310.

According to Example 2, 3, each of a plurality of semiconductor substrates 1 is installed in vertical placement in the liquid bath 210, 310 and can be treated in a state in which the treatment surface of the semiconductor substrate 1 is immersed in the etching liquid 3. The etching apparatus 20, 30 is thus provided which can concurrently treat the plurality of semiconductor substrates 1 even with a relatively small installation area. In the etching apparatus 20, 30, a material having corrosion resistance to the etching liquid 3 has to be used as the material for the sample electrode 221, 321, but the apparatus is still simple because a plurality of semiconductor substrates 1 can be installed at one sample electrode 221, 321.

Example 4

Figure 5:
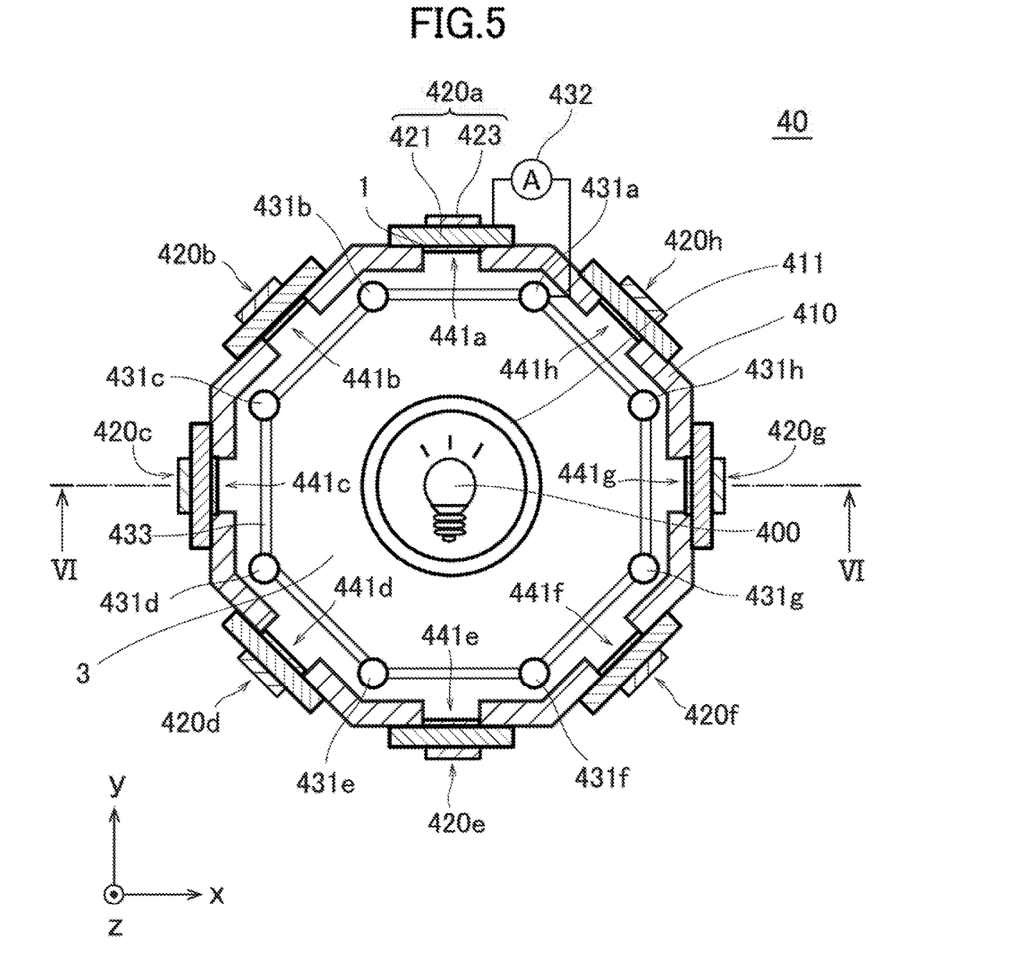
FIG. 5 is a view illustrating the overview of an etching apparatus of Example 4.
Figure 6:
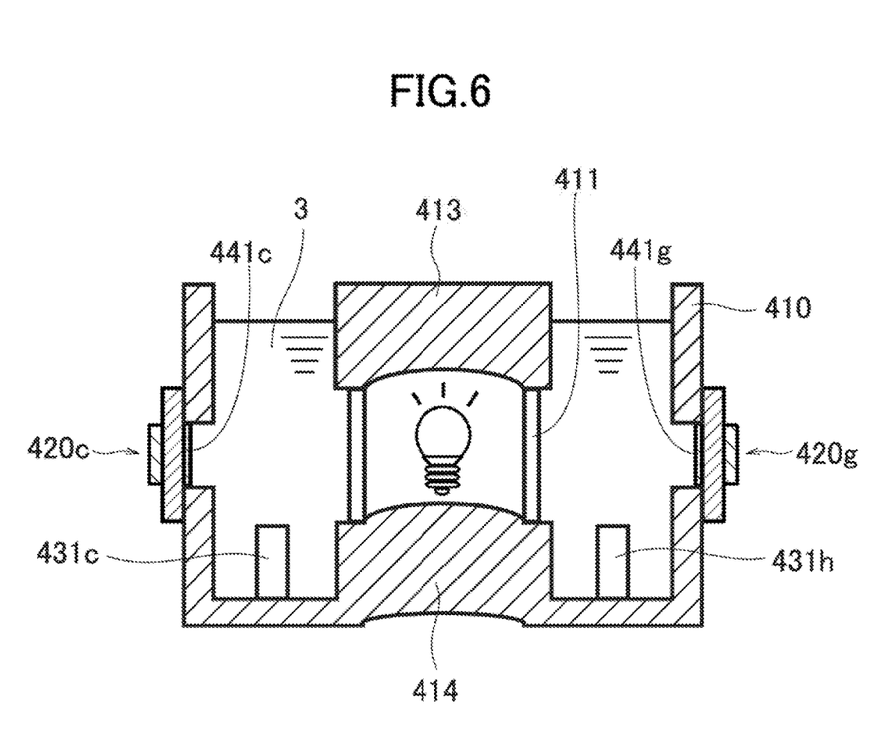
FIG. 6 is a cross-sectional view along line VI-VI of FIG. 5.

FIGS. 5 and 6 illustrate an etching apparatus 40 configured to be capable of concurrent treatment for eight semiconductor substrates 1. A liquid bath 410 is provided which is a container of a double cylinder structure having an approximately octagonal-prismatic outer cylinder part and an approximately cylindrical inner cylinder part and stores an etching liquid 3. The inner cylinder part of the liquid bath 410 comprises a hollow-cylindrical irradiation window 411 and solid cylindrical inner cylinder upper part 413 and inner cylinder lower part 414. The irradiation window 411 is embedded and fixed between the inner cylinder upper part 413 and the inner cylinder lower part 414. The boundary between inside and outside of the irradiation window 411 is sealed so that the etching liquid 3 does not leak into the inside of the irradiation window 411. A light source 400 is housed inside the irradiation window 411.

Eight outer surfaces of the liquid bath 410 are provided with respective substrate installation holes 441a to 441h. As in Example 1, substrate sealing mechanisms and pressing mechanisms are provided around the substrate installation holes 441a to 441h, and rear surface-side members 420a to 420h (which each include a sample electrode 421 and a vibrator 423 fixed to the sample electrode 421) are arranged on the surfaces, which are not to be treated, of the semiconductor substrates 1. The eight semiconductor substrates 1 are pressed against and fixed to the respective substrate installation holes 441a to 441h from the outer surfaces of the liquid bath 410. The inner cylinder part of the liquid bath 410 is provided approximately at the center in the yz-directions and the irradiation window 411 is fixed at a position at which distances from the semiconductor substrates 1 installed at the substrate installation holes 441a to 441h are approximately the same.

The rear surface-side members 420a to 420h are provided with respective counter electrodes 431a to 431h. Each of the counter electrodes 431a to 431h is connected to the corresponding sample electrode 421 through wirings via an ammeter 432 (in FIG. 5, one set of the ammeter 432 and wirings is illustrated and others are omitted). The counter electrodes 431a to 431h may be connected to one another through wirings 433 which form an octagon. Each of the counter electrodes 431a to 431h is disposed outside a region surrounded by a set of straight lines that extend from the circumferential edge of the treatment surface of the semiconductor substrate 1 installed at the corresponding one of the substrate installation holes 441a to 441h toward the irradiation window 411 in the normal direction of the treatment surface of the semiconductor substrate 1. More specifically, each of the counter electrodes 431a to 431h is disposed in the vicinity of the corresponding outer surface of the liquid bath 410 and within a range of a distance from the corresponding semiconductor substrate of about 1 cm.

According to Example 4, each of a plurality of semiconductor substrates 1 is installed in vertical placement in the liquid bath 410 and can be treated in a state in which the treatment surface of the semiconductor substrate 1 is immersed in the etching liquid 3. Moreover, in the etching apparatus 40, the light source is disposed approximately at the center of the liquid bath 410 and emits light toward the semiconductor substrates 1 installed around the light source. Thus, the etching apparatus 40 can concurrently treat the plurality of semiconductor substrates 1 even with a relatively small installation area.

REFERENCE SIGNS LIST

1 Semiconductor substrate
3 Etching liquid
10, 20, 30, 40 Etching apparatus
101, 201, 202, 301 to 304, 400 Light source
110, 210, 310, 410 Liquid bath
111, 211, 212, 311 to 314, 411 Irradiation window
121, 221, 321, 421 Sample electrode
123, 223, 323, 423 Vibrator
131, 231, 331, 431a to 431h Counter electrode

The invention claimed is:

1. An etching apparatus used for photo electrochemical etching of a semiconductor substrate, the etching apparatus comprising:
 a liquid bath storing an etching liquid;
 a substrate installation part capable of supporting the semiconductor substrate in vertical placement at a position at which a treatment surface of the semiconductor substrate is immersed in the etching liquid;
 a sample electrode provided at the substrate installation part and electrically connected to the semiconductor substrate;
 a counter electrode disposed at a position at which the counter electrode is immersed in the etching liquid in the liquid bath;
 a light source irradiating the treatment surface of the semiconductor substrate with light; and
 an irradiation window provided between the treatment surface of the semiconductor substrate and the light source and at a position separated from the semiconductor substrate in a horizontal direction,
 wherein the counter electrode is disposed outside a region surrounded by a set of straight lines that extend from a circumferential edge of the treatment surface of the semiconductor substrate toward the irradiation window in a normal direction of the treatment surface of the semiconductor substrate.

2. The etching apparatus as recited in claim 1, further comprising a stirring mechanism that stirs the etching liquid.

3. The etching apparatus as recited in claim 2, wherein the stirring mechanism is a vibrator that vibrates the semiconductor substrate.

4. The etching apparatus as recited in claim 1, wherein the substrate installation part is provided at a side surface of the liquid bath.

5. The etching apparatus as recited in claim 4, wherein the substrate installation part comprises:
 a substrate installation hole provided at the side surface of the liquid bath;
 a substrate sealing mechanism provided at the side surface of the liquid bath along a circumference of the substrate installation hole; and
 a substrate pressing mechanism that presses the treatment surface of the semiconductor substrate against the substrate sealing mechanism.

6. The etching apparatus as recited in claim 1, wherein the liquid bath further comprises an irradiation window installation part at which the irradiation window is installed.

7. An etching apparatus used for photo electrochemical etching of a plurality of semiconductor substrates, the etching apparatus comprising:
 a liquid bath storing an etching liquid, the liquid bath comprising a cylindrical container storing the etching liquid;
 a plurality of substrate installation parts disposed at an outer surface of the liquid bath, each substrate installation part capable of supporting a respective semiconductor substrate of the plurality of semiconductor substrates in vertical placement at a position at which a treatment surface of the respective semiconductor substrate is immersed in the etching liquid;
 a plurality of sample electrodes, each sample electrode provided at a different substrate installation part of the plurality of substrate installation parts and electrically connected to the respective semiconductor substrate supported by the substrate installation part at which the sample electrode is provided;

a plurality of counter electrodes, each counter electrode disposed at a position at which the counter electrode is immersed in the etching liquid in the liquid bath;

a light source irradiating the treatment surface of the plurality of semiconductor substrates with light, the light source disposed at approximately a center of the liquid bath; and an irradiation window provided between the treatment surfaces of the plurality of semiconductor substrates and the light source and at a position separated from the plurality of semiconductor substrates in a horizontal direction.

8. The etching apparatus as recited in claim 7, wherein:

the cylindrical container is a container of a double cylindrical structure having an outer cylinder part and an inner cylinder part; and the inner cylinder part functions as the irradiation window.

9. The etching apparatus as recited in claim 8, wherein the outer cylinder part has an approximately prismatic shape; and the inner cylinder part has an approximately circular cylindrical shape.

* * * * *